United States Patent
Rubinsztajn et al.

(10) Patent No.: US 6,632,892 B2
(45) Date of Patent: Oct. 14, 2003

(54) COMPOSITION COMPRISING SILICONE EPOXY RESIN, HYDROXYL COMPOUND, ANHYDRIDE AND CURING CATALYST

(75) Inventors: Malgorzata Iwona Rubinsztajn, Niskayuna, NY (US); Slawomir Rubinsztajn, Niskayuna, NY (US)

(73) Assignee: General Electric Company, Niskayuna, NY (US)

( * ) Notice: Subject to any disclaimer, the term of this patent is extended or adjusted under 35 U.S.C. 154(b) by 130 days.

(21) Appl. No.: 09/934,235

(22) Filed: Aug. 21, 2001

(65) Prior Publication Data

US 2003/0071366 A1 Apr. 17, 2003

(51) Int. Cl.$^7$ .................. C08K 5/13; C08K 5/524; C08L 63/00; C08L 83/06
(52) U.S. Cl. ............... 525/476; 523/451; 523/456; 525/474; 525/533
(58) Field of Search ............... 525/474, 533, 525/476; 523/451, 456

(56) References Cited

U.S. PATENT DOCUMENTS

| | | | |
|---|---|---|---|
| 3,792,012 A | * 2/1974 | Zdaniewski | |
| 4,178,274 A | 12/1979 | Denk et al. | 528/297 |
| 5,145,889 A | 9/1992 | Wada et al. | 525/451 |
| 5,198,479 A | 3/1993 | Shiobara et al. | 523/214 |
| 5,391,678 A | 2/1995 | Bard et al. | 528/25 |
| 5,863,970 A | 1/1999 | Ghoshal et al. | 523/434 |
| 6,048,946 A | * 4/2000 | Beisele | 525/403 |

FOREIGN PATENT DOCUMENTS

EP         391162 A2  * 10/1990

OTHER PUBLICATIONS

Polymer Engineering and Science, *"The Synthesis and Cationic Polymerization of Novel Epoxide Monomers"*, James V. Crivello, vol. 32, No. 20, pp. 1462–1465, 1992.

* cited by examiner

*Primary Examiner*—Robert E. L. Sellers
(74) *Attorney, Agent, or Firm*—Andrew J. Caruso; Patrick K. Patnode

(57) ABSTRACT

Epoxy resin compositions are disclosed which comprise (A) at least one silicone epoxy resin, (B) at least one hydroxyl-containing compound, (C) at least one anhydride curing agent, (D) at least one ancillary curing catalyst, and optionally at least one of thermal stabilizers, UV stabilizers, cure modifiers, coupling agents, or refractive index modifiers. Also disclosed are packaged solid state devices comprising a package, a chip (4), and an encapsulant (11) comprising an epoxy resin composition of the invention. A method of encapsulating a solid state device is also provided.

23 Claims, 3 Drawing Sheets

COMPOSITION COMPRISING SILICONE EPOXY RESIN, HYDROXYL COMPOUND, ANHYDRIDE AND CURING CATALYST

BACKGROUND OF THE INVENTION

This invention relates to epoxy resin compositions and solid state devices encapsulated therewith. The invention also relates to a method for encapsulating a solid state device, such as a light emitting diode (LED).

Solid state devices, sometimes referred to as semiconductor devices or opto-electronic devices, comprise LEDs, CCDs, LSIs, photodiodes, phototransistors, photocouplers, opto-electronic couplers and the like. Such devices often exhibit special packaging needs. High-efficiency, high lumen, solid-state white LEDs require a novel packaging material which can withstand more demanding conditions than those required by typical low-intensity, longer wavelength LEDs. Common packaging materials will often undergo a gradual loss of optical and mechanical properties due to the combination of thermal, oxidative and photodegradation processes.

Resins for encapsulation of solid state devices have primarily relied on blends of bisphenol-A epoxy resins and aliphatic anhydride curing agents. As described in U.S. Pat. No. 4,178,274, to Denk et al., one disadvantage of these compositions, which harden fast through the use of known accelerators such as tertiary amines, imidazoles or boron trifluoride complexes, is their poor thermal aging stability. The materials used heretofore become discolored in extended storage at temperatures above 80° C. The resulting resins, which become yellow to brown, have considerably reduced light transmittancy. Furthermore, because of the aromatic character of bisphenol-A based epoxy resins, these encapsulants are typically less stable to ultraviolet radiation. Therefore, these materials may tend to degrade on extended exposure to light having an ultraviolet component. Such degradation can lead to discoloration of the encapsulant and reduced light transmittance.

To circumvent these issues, Denk et al. describe resin compositions for the sealing of opto-electronic components. These resins comprise a (i) cycloaliphatic epoxy resin, (ii) a carbonic acid anhydride (iii) zinc octoate and (iv) a solvent selected from the group consisting of a low molecular weight polyol, a low molecular weight ester and mixtures thereof. The compositions in Denk et al. are at most 46% epoxy resin by weight. Such low levels of epoxy resin and concomitant high levels of curing agents can lead to color formation in the cured resin, reducing the overall transmittance of a LED.

Wada et al. in U.S. Pat. No. 5,145,889 describe a composition consisting essentially of (i) 100 parts by weight of an epoxy resin (ii) 70 to 140 parts by weight of a curing agent including an acid anhydride (iii) 0.5 to 4.0 parts by weight of a curing accelerator including an onium or diazabicycloalkene salt (iv) 0.5 to 5.0 parts by weight of a phosphorus triphosphite and (v) 0.5 to 5.0 parts by weight of a silane coupling agent represented certain formulas. The compositions in Wada et al. are at most 58% epoxy resin by weight. Such high levels of curing agents can lead to color formation during thermal curing of the resin encapsulant, reducing the overall transmittance of a LED. Furthermore, said encapsulating resin requires the use of a cure accelerator such as an onium or diazabicycloalkene salts to enhance cure rates and allow for reasonable processing times.

Ghoshal and Mukerji in U.S. Pat. No. 5,863,970 describe a composition useful as a die attach adhesive, polymer bump or encapsulating material comprising a mixture of silicone epoxy resin and non-silicone epoxy resins cured with an iodonium salt. The addition of non-silicone epoxy resin, especially an aromatic, bisphenol-A type epoxy resin, would make the encapsulants less stable to ultraviolet radiation and temperature exposure. Furthermore, materials such as diaryliodonium salts often produce high colors upon cure.

There is a continuing need for novel packaging material for solid state devices, such packaging material desirably possessing properties such as high transmission in a range from near UV to the visible wavelength; long term thermal, oxidative and UV stability; thermal compliance with other materials used to envelope the solid state device; low color; and high reflective index.

SUMMARY OF INVENTION

The present inventors have discovered curable resin compositions ideally suited for an encapsulation of solid state devices such as light emitting diodes. In one embodiment the present invention relates to a curable epoxy resin composition for encapsulation of a solid state device, which comprises (A) at least one silicone epoxy resin, (B) at least one hydroxyl-containing compound, (C) at least one anhydride curing agent, and (D) at least one ancillary curing catalyst.

In another embodiment of the present invention, there is provided a packaged solid state device comprising: (a) a package; (b) a chip; and (c) an encapsulant comprising: (A) at least one silicone epoxy resin, (B) at least one hydroxyl-containing compound, (C) at least one anhydride curing agent, and (D) at least one ancillary curing catalyst.

In another embodiment of the present invention, there is provided a method of encapsulating a solid state device comprising: placing a solid state device into a package; and providing an encapsulant comprising: (A) at least one silicone epoxy resin, (B) at least one hydroxyl-containing compound, (C) at least one anhydride curing agent, and (D) at least one ancillary curing catalyst.

Various other features, aspects, and advantages of the present invention will become more apparent with reference to the following description and appended claims.

DETAILED DESCRIPTION

Figure 1:
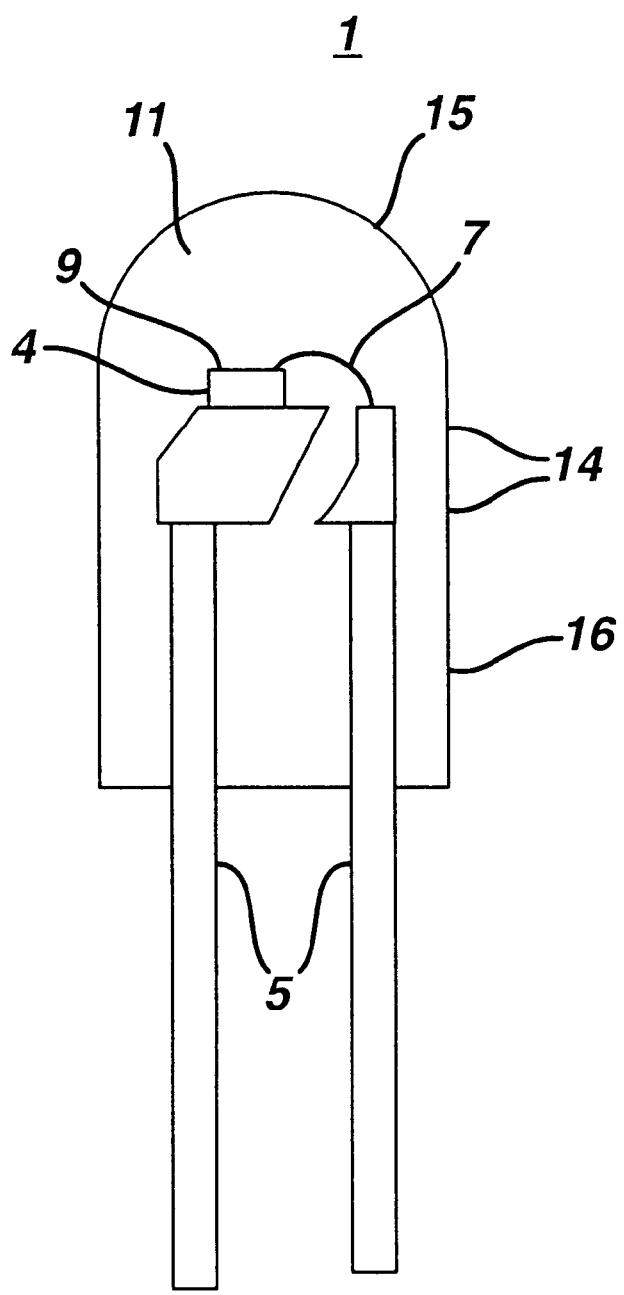
FIG. 1 is a schematic illustration of a LED according to one embodiment of the present invention.

Silicone epoxy resins useful as component (A) in the present invention comprise those known in the art. In some embodiments silicone epoxy resins comprise at least one silicon moiety selected from the group consisting of $R_3SiO_{0.5}$ (M moieties), $R_2SiO$ (D moieties), $RSiO_{1.5}$ (T moieties), and $SiO_2$ (Q moieties), in combination with at least one epoxy-containing silicone moiety selected from the group consisting of $EpR_2SiO_{0.5}$, $EpRSiO$, and $EpSiO_{1.5}$, wherein Ep is an epoxy moiety selected from the group consisting of a glycidoxy propyl moiety as in formula (I), a 3,4-epoxycyclohexane ethyl moiety as in formula (II), and a 1,2-epoxy hexyl moiety as in formula (III):

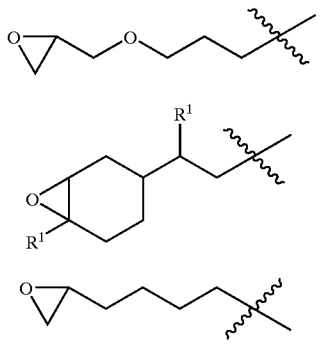

(I)

(II)

(III)

wherein R is monovalent alkyl, halogenated alkyl, or aryl, and $R^1$ is hydrogen or alkyl. In some embodiments R is selected from the group consisting of methyl, 3,3,3-trifluoropropyl, and phenyl, and mixtures thereof. In some embodiments $R^1$ is either hydrogen or methyl. Moieties of the formulas (I), (II), and (III) are often derived from hydrosilylation of an appropriate olefinic epoxy compound with Si—H containing moiety. In particular embodiments silicone epoxy resins comprise those depicted in formulas (IV), (V), (VI), (VII), (VIII), and (IX):

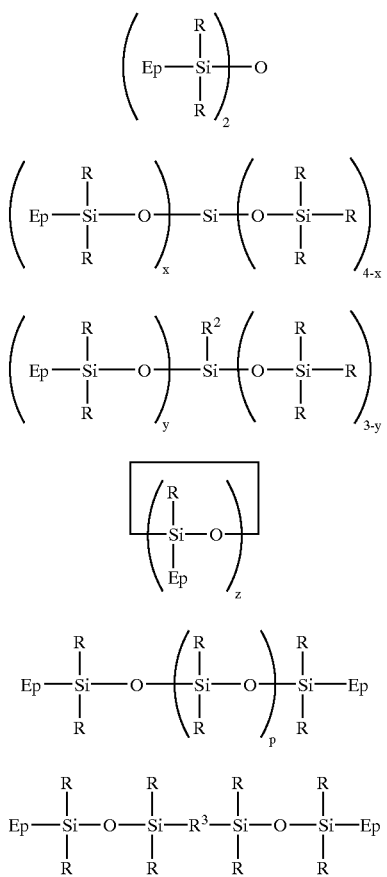

(IV)

(V)

(VI)

(VII)

(VIII)

(IX)

wherein the abbreviation "Ep" designates an epoxy-containing residue comprising any of the epoxy structures depicted in formulas (I), (II), or (III); R is as previously defined; $R^2$ is monovalent alkyl, halogenated alkyl, or aryl; $R^3$ is divalent alkyl, halogenated alkyl, or aryl; x is an integer between 1 and 4 inclusive; y is an integer between 1 and 3 inclusive; z is an integer between 3 and 12 inclusive; and p is an integer having a value of 1 to about 80. In certain embodiments R in structures (IV)–(IX) is methyl. In a particular embodiment of structure (IV) R is methyl and Ep has the structure of formula (II) in which $R^1$ is hydrogen. In a particular embodiment of structure (IV) R is methyl and Ep has the structure of formula (I). In a particular embodiment of structure (IV) R is methyl and Ep has the structure of formula (II) in which $R^1$ is methyl. In a particular embodiment of structure (IV) R is methyl and Ep has the structure of formula (III). In certain embodiments of structure (V) R is methyl and Ep has the structure of formula (II) in which $R^1$ is hydrogen. In a particular embodiment of structure (V) R is methyl, x has the value of 4, and Ep has the structure of formula (II) in which $R^1$ is hydrogen. In certain embodiments of structure (VI) R is methyl, $R^2$ is methyl or phenyl, and Ep has the structure of formula (II) in which $R^1$ is hydrogen. In a particular embodiment of structure (VI) R is methyl, $R^2$ is methyl, y has the value of 3, and Ep has the structure of formula (II) in which $R^1$ is hydrogen. In a particular embodiment of structure (VI) R is methyl, $R^2$ is phenyl, y has the value of 3, and Ep has the structure of formula (II) in which $R^1$ is hydrogen. In a particular embodiment of structure (VII) R is methyl, z has the value of 4, and Ep has the structure of formula (II) in which $R^1$ is hydrogen. In certain embodiments of structure (VIII) Ep has the structure of formula (II) in which $R^1$ is hydrogen, and p is an integer between about 1 and about 70. In certain embodiments of structure (VIII) Ep has the structure of formula (II) in which $R^1$ is hydrogen, and p is an integer between about 2 and about 70. In certain embodiments of structure (VIII) Ep has the structure of formula (II) in which $R^1$ is hydrogen, and p is an integer between about 50 and about 70. In certain embodiments of structure (VIII) Ep has the structure of formula (II) in which $R^1$ is hydrogen, and p is an integer between about 2 and about 5. In a particular embodiment of structure (VIII) Ep has the structure of formula (II) in which $R^1$ is hydrogen, and p has the value of 2. In certain embodiments of structure (IX) $R^3$ is divalent alkyl and Ep has the structure of formula (II) in which $R^1$ is hydrogen. In certain embodiments of structure (IX) $R^3$ is a straight-chain alkyl with 1 to 10 carbon atoms and Ep has the structure of formula (II) in which $R^1$ is hydrogen. In certain embodiments of structure (IX) $R^3$ is a straight-chain alkyl with 3 to 8 carbon atoms and Ep has the structure of formula (II) in which $R^1$ is hydrogen. In a particular embodiment of structure (IX) $R^3$ is a straight-chain alkyl with 6 carbon atoms and Ep has the structure of formula (II) in which $R^1$ is hydrogen.

In other particular embodiments silicone epoxy resins comprise those depicted in formula (X):

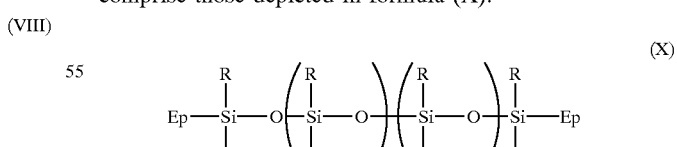

(X)

wherein R and Ep are as previously defined; m is an integer between about 20 and about 100; and n is an integer between about 1 and about 20. In some embodiments of formula (X) R is methyl; Ep has the structure of formula (II) in which $R^1$ is hydrogen; m is an integer between about 40 and about 100; and n is an integer between about 3 and about 10. In other embodiments of formula (X) R is methyl; Ep has the structure of formula (II) in which R¹ is hydrogen; m is an integer between about 55 and about 65; and n is an integer between about 3 and about 7.

Hydroxyl-containing additives useful as component (B) in the present invention comprise those with at least one OH group. In various embodiments hydroxyl-containing additives comprise alcohols such as polyfunctional alcohols such as diols, triols, etc., and bisphenols, trisphenols, etc. Further, the alcohol group in such compounds may be primary, secondary or tertiary, or mixtures thereof. In particular embodiments the alcohol group is secondary or tertiary. Representative examples comprise benzyl alcohol, cyclohexanemethanol, alkyl diols, cyclohexanedimethanol, ethylene glycol, propylene glycol, butanediol, pentanediol, hexanediol, heptanediol, octanediol, polyethylene glycol, glycerol, polyether polyols such as those sold under the trade name VORANOL by the Dow Chemical Company, and the like.

In some embodiments hydroxyl-containing additives useful as component (B) in the present invention comprise hydroxyl-containing silicone resins. Hydroxyl-containing silicone resins comprise at least one Si—OH bond. In various embodiments silicone resins useful as component (B) comprise silicone T resins which contain at least one Si—OH bond. In a particular embodiment silicone T resins useful as component (B) comprise those with the formula (i):

$$R^4_a SiO_{\left(\frac{4-a-b}{2}\right)}(OH)_b \qquad (i)$$

wherein R⁴ is a monovalent hydrocarbon radical or a halogenated monovalent hydrocarbon radical. In various embodiments R⁴ is selected from the group consisting of alkyl, methyl, ethyl, propyl, halogenated alkyl, 3,3,3-trifluoropropyl, unsaturated alkyl, vinyl, aryl, phenyl, tolyl, benzyl, styryl, and mixtures thereof. In one embodiment silicone T resin comprises a copolymer of the formula (i) in which R⁴ is a mixture of methyl and phenyl groups. In another embodiment silicone resins useful as component (B) comprise at least one silicone T/D copolymer. In a particular embodiment silicone resins useful as component (B) comprise at least one silicone methyl/phenyl T/D copolymer. In various embodiments suitable silicone resins comprise structural units of the formulas $CH_3SiO_{3/2}$, $(CH_3)_2SiO$, $(CH_3)_2SiO_{1/2}$, $C_6H_5SiO_{3/2}$, $(C_6H_5)_2SiO$, $(C_6H_5)(CH_3)SiO$, $(C_6H_5)(CH_3)SiO_{1/2}$, $CH_2=CHSiO_{3/2}$, and mixtures thereof. The parameter "a" has in one embodiment a value in a range of between about 0.8 and about 1.9, in another embodiment a value in a range of between about 1.0 and about 1.7, and in another embodiment a value in a range of between about 1.1 and about 1.6. The parameter "b" has a value such that in one embodiment at least about 0.2 wt. % OH groups are present in the resin, in another embodiment at least about 2 wt. % OH groups are present in the resin, and in another embodiment at least about 6 wt. % OH groups are present in the resin. In a particular embodiment suitable silicone T resin comprises the hydrolysis product of a mixture of phenyltrichlorosilane, methyltrichlorosilane, and dimethyldichlorosilane.

In some embodiments hydroxy-containing additives useful as component (B) may be substantially miscible with silicone epoxy resin employed as component (A). Substantially miscible in the present context means that a mixture of hydroxyl-containing compound (component (B)) and silicone epoxy resin (component (A)) exhibits single phase behavior and is transparent. In other embodiments hydroxy-containing additives useful as component (B) may be at least partially miscible with silicone epoxy resin (A), or may be substantially immiscible with silicone epoxy resin (A). In some embodiments hydroxy-containing additives useful as component (B) may be substantially miscible with silicone epoxy resin employed as component (A), either at room temperature, or in a partially cured state, or in a cured state. In other embodiments hydroxy-containing additives useful as component (B) may be at least partially miscible with silicone epoxy resin (A), either at room temperature, or in a partially cured state, or in a cured state. In one embodiment a hydroxy-containing additive may be substantially immiscible with silicone epoxy resin employed as component (A) at room temperature, and substantially miscible in a cured state.

Anhydride curing agents useful as component (C) in the present invention comprise those known in the art. Illustrative examples are described in "Chemistry and Technology of the Epoxy Resins" B. Ellis (Ed.) Chapman Hall, New York, 1993 and in "Epoxy Resins Chemistry and Technology", edited by C. A. May, Marcel Dekker, New York, 2nd edition, 1988. In various embodiments anhydride curing agents comprise at least one of bicyclo[2.2.1]hept-5-ene-2,3-dicarboxylic anhydride, methylbicyclo[2.2.1]hept-5-ene-2,3-dicarboxylic anhydride, bicyclo[2.2.1]hept-5-ene-2,3-dicarboxylic anhydride, phthalic anhydride, pyromellitic dianhydride, hexahydrophthalic anhydride, hexahydro-4-methylphthalic anhydride, dodecenylsuccinic anhydride, dichloromaleic anhydride, chlorendic anhydride, tetrachlorophthalic anhydride, and the like. Mixtures comprising at least two anhydride curing agents may also be used.

The amounts of silicone epoxy resin (A), hydroxyl-containing compound (B), and curing agent (C) can be varied over a wide range. In various embodiments the amount of silicone epoxy resin (A) in the composition is greater than about 40% by weight based on the combined weight of silicone epoxy resin (A), hydroxyl-containing compound (B), curing agent (C), and ancillary curing catalyst (D). In some embodiments the amount of silicone epoxy resin (A) in the composition is in a range of between about 40% by weight and about 99% by weight based on the combined weight of silicone epoxy resin (A), hydroxyl-containing compound (B), curing agent (C), and ancillary curing catalyst (D). In other embodiments the amount of silicone epoxy resin (A) in the composition is in a range of between about 76% by weight and about 99% by weight based on the combined weight of silicone epoxy resin (A), hydroxyl-containing compound (B), curing agent (C), and ancillary curing catalyst (D).

In various embodiments the amount of hydroxyl-containing compound (B) in the composition is in a range of between about 1% by weight and about 20% by weight based on the combined weight of silicone epoxy resin (A), hydroxyl-containing compound (B), curing agent (C), and ancillary curing catalyst (D). In other embodiments the amount of hydroxyl-containing compound (B) in the composition is in a range of between about 2% by weight and about 10% by weight based on the combined weight of silicone epoxy resin (A), hydroxyl-containing compound (B), curing agent (C), and ancillary curing catalyst (D). In some embodiments the amount of hydroxyl-containing compound (B) in the composition is in a range of between about 4% by weight and about 8% by weight based on the combined weight of silicone epoxy resin (A), hydroxyl-containing compound (B), curing agent (C), and ancillary curing catalyst (D).

In various embodiments the amount of curing agent (C) in the composition is less than about 40% by weight based on the combined weight of silicone epoxy resin (A), hydroxyl-containing compound (B), curing agent (C), and ancillary curing catalyst (D). In other embodiments the amount of curing agent (C) in the composition is less than about 25% by weight based on the combined weight of silicone epoxy resin (A), hydroxyl-containing compound (B), curing agent (C), and ancillary curing catalyst (D). In some embodiments the amount of curing agent (C) in the composition is in a range of between about 1% by weight and about 24% by weight based on the combined weight of silicone epoxy resin (A), hydroxyl-containing compound (B), curing agent (C), and ancillary curing catalyst (D). In other embodiments the amount of curing agent (C) in the composition is in a range of between about 10% by weight and about 20% by weight based on the combined weight of silicone epoxy resin (A), hydroxyl-containing compound (B), curing agent (C), and ancillary curing catalyst (D).

Ancillary curing catalysts useful as component (D) in the present invention comprise those known in the art. Illustrative examples are described in "Chemistry and Technology of the Epoxy Resins" edited by B. Ellis, Chapman Hall, New York, 1993, and in "Epoxy Resins Chemistry and Technology", edited by C. A. May, Marcel Dekker, New York, 2nd edition, 1988. In various embodiments the ancillary curing catalyst comprises an organometallic salt, a sulfonium salt or an iodonium salt. In particular embodiments the ancillary curing catalyst comprises at least one of a metal carboxylate, a metal acetylacetonate, zinc octoate, stannous octoate, triarylsulfonium hexafluorophosphate, triarylsulfonium hexafluoroantimonate (such as CD 1010 sold by Sartomer Corporation), diaryliodonium hexafluoroantimonate, or diaryliodonium tetrakis (pentafluorophenyl)borate. In various embodiments the amount of ancillary curing catalyst (D) in the composition is less than about 10% by weight based on the combined weight of silicone epoxy resin (A), hydroxyl-containing compound (B), curing agent (C), and ancillary curing catalyst (D). In some embodiments the amount of ancillary curing catalyst (D) in the composition is in a range between about 0.008% by weight and about 10% by weight based on the combined weight of silicone epoxy resin (A), hydroxyl-containing compound (B), curing agent (C), and ancillary curing catalyst (D). In other embodiments the amount of ancillary curing catalyst (D) in the composition is in a range between about 0.01% by weight and about 5% by weight based on the combined weight of silicone epoxy resin (A), hydroxyl-containing compound (B), curing agent (C), and ancillary curing catalyst (D). In some embodiments the amount of ancillary curing catalyst (D) in the composition is in a range between about 0.01% by weight and about 1.0% by weight based on the combined weight of silicone epoxy resin (A), hydroxyl-containing compound (B), curing agent (C), and ancillary curing catalyst (D). In other embodiments the amount of ancillary curing catalyst (D) in the composition is in a range between about 0.01% by weight and about 0.5% by weight based on the combined weight of silicone epoxy resin (A), hydroxyl-containing compound (B), curing agent (C), and ancillary curing catalyst (D).

One or more thermal stabilizers or UV-stabilizers or mixtures thereof may optionally be present in the compositions of the invention. Such stabilizers may reduce color formation during processing of the encapsulant. Many stabilizers to improve the thermal and or UV stability are known in the art and have been described in numerous patents and publications such as in J. F. Rabek, "Photostabilization of Polymers; Principles and Applications", Elsevier Applied Science, NY, 1990 and in "Plastics Additives Handbook", 5th edition, edited by H. Zweifel, Hanser Publishers, 2001. Illustrative examples of suitable stabilizers comprise organic phosphites and phosphonites, such as triphenyl phosphite, diphenylalkyl phosphites, phenyldialkyl phosphites, tri-(nonylphenyl) phosphite, trilauryl phosphite, trioctadecyl phosphite, di-stearyl-pentaerythritol diphosphite, tris-(2,4-di-tert-butylphenyl) phosphite, di-isodecylpentaerythritol diphosphite, di-(2,4-di-tert-butylphenyl) pentaerythritol diphosphite, tristearyl-sorbitol triphosphite, and tetrakis-(2,4-di-tert-butylphenyl)-4,4'-biphenyldiphosphonite. Illustrative examples of suitable stabilizers also comprise sulfur-containing phosphorus compounds such as trismethylthiophosphite, trisethylthiophosphite, trispropylthiophosphite, trispentylthiophosphite, trishexylthiophosphite, trisheptylthiophosphite, trisoctylthiophosphite, trisnonylthiophosphite, trislaurylthiophosphite, trisphenylthiophosphite, trisbenzylthiophosphite, bispropiothiomethylphosphite, bispropiothiononylphosphite, bisnonylthiomethylphosphite, bisnonylthiobutylphosphite, methylethylthiobutylphosphite, methylethylthiopropiophosphite, methylnonylthiobutylphosphite, methylnonylthiolaurylphosphite, and pentylnonylthiolaurylphosphite. These compounds can be used singly or in a combination of at least two compounds.

Suitable stabilizers also comprise sterically hindered phenols which are known in the art. Illustrative examples of sterically hindered phenol stabilizers comprise 2-tertiary-alkyl-substituted phenol derivatives, 2-tertiary-amyl-substituted phenol derivatives, 2-tertiary-octyl-substituted phenol derivatives, 2-tertiary-butyl-substituted phenol derivatives, 2,6-di-tertiary-butyl-substituted phenol derivatives, 2-tertiary-butyl-6-methyl- (or 6-methylene-) substituted phenol derivatives, and 2,6-di-methyl-substituted phenol derivatives. These compounds can be used singly or in a combination of at least two compounds. In certain particular embodiments sterically hindered phenol stabilizers comprise alpha-tocopherol and butylated hydroxy toluene.

Suitable stabilizers also comprise sterically hindered amines, illustrative examples of which comprise bis-(2,2,6,6-tetramethylpiperidyl) sebacate, bis-(1,2,2,6,6-pentamethylpiperidyl) sebacate, n-butyl-3,5-di-tert-butyl-4-hydroxybenzyl malonic acid bis-(1,2,2,6,6-pentamethylpiperidyl)ester, condensation product of 1-hydroxyethyl-2,2,6,6-tetramethyl-4-hydroxypiperidine and succinic acid, condensation product of N,N'-(2,2,6,6-tetramethylpiperidyl)-hexamethylenediamine and 4-tert-octyl-amino-2,6-dichloro-s-triazine, tris-(2,2,6,6-tetramethylpiperidyl)-nitrilotriacetate, tetrakis-(2,2,6,6-tetramethyl-4-piperidyl)-1,2,3,4-butanetetracarboxylate, and 1,1'-(1,2-ethanediyl)-bis-(3,3,5,5-tetramethylpiperazinone). These compounds can be used singly or in a combination of at least two compounds.

Suitable stabilizers also comprise compounds which destroy peroxide, illustrative examples of which comprise esters of beta-thiodipropionic acid, for example the lauryl, stearyl, myristyl or tridecyl esters; mercaptobenzimidazole or the zinc salt of 2-mercaptobenzimidazole; zinc dibutyl-dithiocarbamate; dioctadecyl disulfide; and pentaerythritol tetrakis-(beta-dodecylmercapto)-propionate. These compounds can be used singly or in a combination of at least two compounds.

Optional components in the present invention also comprise cure modifiers which may modify the rate of cure of epoxy resin. In various embodiments cure modifiers comprise at least one of cure accelerators or cure inhibitors. Cure modifiers may comprise compounds containing heteroatoms that possess lone electron pairs. Phosphites may be used as cure modifiers. Illustrative examples of phosphites comprise trialkylphosphites, triarylphosphites, trialkylthiophosphites, and triarylthiophosphites. In some embodiments phosphites comprise triphenyl phosphite, benzyldiethyl phosphite, or tributyl phosphite. Other suitable cure modifiers comprise sterically hindered amines and 2,2,6,6-tetramethylpiperidyl residues, such as for example bis(2,2,6,6-tetramethylpiperidyl) sebacate. Mixtures of cure modifiers may also be employed.

Optional components in the present invention also comprise coupling agents which in various embodiments may help epoxy resin bind to a matrix, such as a glass matrix, so as to form a strong bond to the surface such that premature failure does not occur. Coupling agents comprise compounds that contain both silane and mercapto moieties, illustrative examples of which comprise mercaptomethyltriphenylsilane, beta-mercaptoethyltriphenylsilane, beta-mercaptopropyltriphenylsilane, gamma-mercaptopropyldiphenylmethylsilane, gamma-mercaptopropylphenyldimethylsilane, delta-mercaptobutylphenyldimethylsilane, delta-mercaptobutyltriphenylsilane, tris(beta-mercaptoethyl)phenylsilane, tris(gamma-mercaptopropyl)phenylsilane, tris(gamma-mercaptopropyl)methylsilane, tris(gamma-mercaptopropyl)ethylsilane, and tris(gamma-mercaptopropyl)benzylsilane. Coupling agents also comprise compounds which comprise both an alkoxysilane and an organic moiety, illustrative examples of which comprise compounds of the formula $(R^5O)_3Si$—$R^6$ wherein $R^5$ is an alkyl group and $R^6$ is selected from the group consisting of vinyl, 3-glycidoxypropyl, 3-mercaptopropyl, 3-acryloxypropyl, 3-methacryloxypropyl, and $C_nH_{2n+1}$. In some embodiments $R^5$ is methyl or ethyl, and n has the value of 4–16. In other embodiments coupling agents comprise those comprising both an alkoxysilane and an epoxy moiety. Coupling agents can be used singly or in a combination of at least two compounds.

Optional components in the present invention also comprise refractive index modifiers. As light passes from the relatively high index of diffraction chip (typically 2.8–3.2) to the lower refractive index epoxy encapsulant (typically 1.2–1.6) some of the light is reflected back to the chip at the critical angle. Modifiers with high refractive index added to the epoxy increase its refractive index, producing a better match of the two refractive indices and an increase in the amount of emitted light. Such materials increase the refractive index of the epoxy without significantly affecting the transparency of the epoxy encapsulant. Modifiers of this type comprise additives with high refractive index. These materials comprise optically transparent organics or inorganics, and agglomerates of particles or structures whose size is less than the size of the wavelength of the emitted light. Such agglomerates are sometimes referred to as nanoparticles. Such materials are known in the art and comprise a variety of transparent metal oxides or group II–VI materials that are relatively free from scattering. In one embodiment, a nanoparticle material is titanium dioxide. In other embodiments other types of transparent metal oxides or combinations of metal oxides can be used. For example, magnesium oxide, yttria, zirconia, cerium oxides, alumina, lead oxides, and composite materials such as those comprising yttria and zirconia can be used to produce nanoparticles. In yet other embodiments nanoparticles are made from one of the group II–VI materials comprising zinc selenide, zinc sulphide, and alloys made from Zn, Se, S, and Te. Alternatively, gallium nitride, silicon nitride, or aluminum nitride can be also used to make nanoparticles.

The compositions of the present invention can be prepared by combining the various components, including optional components, in any convenient order. In various embodiments all the components may be mixed together. In other embodiments two or more components may be premixed and then subsequently combined with other components. In one embodiment the components of the compositions of the invention comprise a two-part composition, wherein the various components are premixed in at least two separate compositions before combination to provide a final composition.

Encapsulation techniques for solid state devices are well known to the art and may be used in the present invention. In various embodiments such techniques comprise casting, resin transfer molding and the like. After the solid state device is enveloped in the uncured resin, typically performed in a mold, the resin is cured. These resins may be cured in one or more stages using art-known methods comprising thermal, UV or electron beam techniques or combination thereof. For example, thermal cure may be performed at temperatures in one embodiment in a range of from about room temperature to about 200° C., in another embodiment in a range of from about 80° C. to about 200° C., in another embodiment in a range of from about 100° C. to about 200° C., and in another embodiment in a range of from about 120° C. to about 160° C. Also in other embodiments these materials can be photo-chemically cured, initially at about room temperature, using art-known techniques. Although some thermal excursion from the photochemical reaction and subsequent cure can occur, no external heating is typically required. In other embodiments these materials may be cured in two stages wherein an initial thermal or UV cure, for example, may be used to produce a partially hardened or B-staged epoxy resin. This material, which is easily handled, may then be further cured using, for example, either thermal or UV techniques, to produce a material with the desired thermal performance (for example Tg, CTE), optical properties and moisture resistance required for encapsulated solid state devices.

Without further elaboration, it is believed that one skilled in the art can, using the description herein, utilize the present invention to its fullest extent. The following examples are included to provide additional guidance to those skilled in the art in practicing the claimed invention. The examples provided are merely representative of the work that contributes to the teaching of the present application. Accordingly, these examples are not intended to limit the invention, as defined in the appended claims, in any manner.

EXAMPLES 1–3

Epoxy resin encapsulants were prepared by combining the various epoxy-comprising resins, curing agents and other components as shown in Table 1, and curing under the specified conditions. All quantities are in parts by weight. The abbreviation "RT" means room temperature. The composition of Example 3 also contained 0.08 wt. % of a hindered phenol stabilizer and 0.08 wt. % of a phosphite stabilizer. 1,1,3,3-Tetramethyl-1,3-bis[2(7-oxabicyclo[4.1.0]hept-3-yl)ethyl]disiloxane was employed as silicone epoxy resin. The hydroxyl-containing compound (B) was a hydroxyl-containing silicone resin comprising the hydroly sis product of a mixture of phenyltrichlorosilane, methyltrichlorosilane, and dimethyldichlorosilane.

TABLE 1

| Component | Ex. 1 | Ex. 2 | Ex. 3 |
|---|---|---|---|
| Component A epoxy resin | | | |
| 3,4-epoxycyclohexylmethyl-3,4-epoxycyclohexanecarboxylate (ERL 4221D) | 73 | 28.9 | — |
| bisphenol-A diglycidyl ether oligomer (EPON 828) | — | 36.2 | — |
| silicone epoxy resin | — | — | 78.38 |
| Component B | | | |
| hydroxyl-containing silicone compound | — | — | 5.42 |
| 2,5-hexanediol | 3 | — | — |
| Component C curing agent | | | |
| hexahydro-4-methylphthalic anhydride | 17 | 32.2 | 15.58 |
| Component D ancillary curing catalyst | | | |
| trimethoxyboroxine | 3 | — | — |
| zinc octoate | — | 0.1 | 0.46 |
| Optional components | | | |
| triphenyl phosphite | 2 | 2.6 | — |
| glycidoxypropyltrimethoxysilane | 2 | — | — |
| Processing | | | |
| Cure time, time (hrs.)/temp. (° C.) | 1/110, then 3/150 | 4/150 | 0.5/120, then 3.5/150 |
| Properties | | | |
| Tg (° C.) | 131 | 127 | 141 |
| Pot life (min.)* | 4 | 12 | 12 |

*values are approximate

The values for initial % transmission at a wavelength were measured on 5 mm thick specimens. The values are shown in Table 2.

TABLE 2

| % transmission at wavelength | Ex. 1 | Ex. 2 | Ex. 3 |
|---|---|---|---|
| 360 | 49.40 | 27.36 | 53.70 |
| 370 | 60.62 | 42.35 | 63.44 |
| 380 | 69.57 | 57.13 | 71.77 |
| 390 | 75.57 | 66.89 | 78.35 |
| 400 | 79.72 | 73.40 | 83.29 |
| 410 | 82.48 | 77.29 | 86.50 |
| 420 | 84.35 | 79.70 | 88.40 |
| 430 | 85.67 | 82.02 | 89.58 |
| 440 | 86.69 | 83.70 | 90.33 |
| 450 | 87.39 | 84.85 | 90.81 |
| 460 | 87.96 | 85.72 | 91.16 |
| 470 | 88.44 | 86.49 | 91.42 |
| 480 | 88.76 | 87.08 | 91.59 |
| 490 | 89.04 | 87.49 | 91.73 |
| 500 | 89.24 | 87.79 | 91.81 |
| 510 | 89.40 | 88.04 | 91.88 |
| 520 | 89.57 | 88.26 | 91.93 |
| 530 | 89.68 | 88.40 | 91.98 |
| 540 | 89.76 | 88.51 | 92.01 |
| 550 | 89.87 | 88.61 | 92.03 |
| 560 | 89.93 | 88.71 | 92.05 |
| 570 | 89.96 | 88.77 | 92.07 |
| 580 | 90.00 | 88.79 | 92.07 |
| 590 | 90.03 | 88.83 | 92.09 |
| 600 | 90.08 | 88.90 | 92.10 |
| 610 | 90.06 | 88.89 | 92.08 |
| 620 | 90.06 | 88.91 | 92.11 |
| 630 | 90.09 | 88.94 | 92.10 |
| 640 | 90.11 | 88.99 | 92.11 |
| 650 | 90.15 | 89.02 | 92.15 |
| 660 | 90.16 | 89.02 | 92.18 |
| 670 | 90.17 | 89.02 | 92.18 |
| 680 | 90.18 | 89.05 | 92.15 |
| 690 | 90.21 | 89.07 | 92.24 |
| 700 | 90.23 | 89.09 | 92.24 |
| 710 | 90.25 | 89.10 | 92.19 |
| 720 | 90.23 | 89.09 | 92.24 |
| 730 | 90.21 | 89.11 | 92.18 |
| 740 | 90.07 | 89.02 | 92.02 |
| 750 | 89.92 | 88.90 | 91.79 |

A composition of the invention (Example 3) shows improved initial transmission especially in the near UV region of the spectrum (about 400–450 nm) compared to Example 1 containing cycloaliphatic epoxy resin and Example 2 containing aromatic epoxy resin.

The values for % transmission at a wavelength were also measured on 5 mm thick specimens after 500 hours exposure in a Weatherometer using a xenon lamp with filter to cut off radiation below wavelength of 380 nm. The values are shown in Table 3.

TABLE 3

| % transmission at wavelength | Ex. 1 | Ex. 2 | Ex. 3 |
|---|---|---|---|
| 360 | 68.16 | 53.16 | 71.00 |
| 370 | 74.79 | 64.40 | 77.21 |
| 380 | 78.98 | 71.98 | 81.33 |
| 390 | 81.63 | 76.77 | 84.16 |
| 400 | 83.38 | 79.85 | 86.10 |
| 410 | 84.52 | 81.71 | 87.68 |
| 420 | 85.36 | 83.05 | 88.67 |
| 430 | 85.97 | 84.06 | 89.36 |
| 440 | 86.51 | 84.92 | 89.89 |
| 450 | 86.97 | 85.63 | 90.28 |
| 460 | 87.36 | 86.21 | 90.57 |
| 470 | 87.77 | 86.75 | 90.81 |
| 480 | 87.96 | 87.15 | 90.97 |
| 490 | 88.19 | 87.52 | 91.10 |
| 500 | 88.36 | 87.81 | 91.21 |
| 510 | 88.47 | 88.06 | 91.28 |
| 520 | 88.60 | 88.27 | 91.36 |
| 530 | 88.72 | 88.47 | 91.42 |
| 540 | 88.79 | 88.58 | 91.46 |
| 550 | 88.88 | 88.74 | 91.49 |
| 560 | 88.93 | 88.84 | 91.50 |
| 570 | 88.98 | 88.94 | 91.51 |
| 580 | 89.01 | 89.01 | 91.53 |
| 590 | 89.06 | 89.09 | 91.53 |
| 600 | 89.12 | 89.13 | 91.55 |
| 610 | 89.11 | 89.18 | 91.55 |
| 620 | 89.17 | 89.23 | 91.55 |
| 630 | 89.22 | 89.26 | 91.55 |
| 640 | 89.29 | 89.30 | 91.59 |
| 650 | 89.37 | 89.35 | 91.63 |
| 660 | 89.43 | 89.39 | 91.66 |
| 670 | 89.45 | 89.41 | 91.68 |
| 680 | 89.51 | 89.45 | 91.71 |
| 690 | 89.61 | 89.53 | 91.79 |
| 700 | 89.62 | 89.51 | 91.79 |
| 710 | 89.62 | 89.51 | 91.78 |
| 720 | 89.67 | 89.56 | 91.82 |
| 730 | 89.60 | 89.54 | 91.74 |
| 740 | 89.50 | 89.46 | 91.60 |
| 750 | 89.33 | 89.28 | 91.39 |

A composition of the invention (Example 3) shows improved UV stability and improved transmission especially in the near UV region of the spectrum (about 400–450 nm) compared to Example 1 containing cycloaliphatic epoxy resin and Example 2 containing aromatic epoxy resin.

The values for % transmission at a wavelength were measured on 5 mm thick specimens after 500 hours exposure to a temperature of 150° C. The values are shown in Table 4.

TABLE 4

| % transmission at wavelength | Ex. 1 | Ex. 2 | Ex. 3 |
|---|---|---|---|
| 360 | 17.86 | 6.74 | 34.98 |
| 370 | 28.21 | 13.94 | 44.48 |
| 380 | 39.09 | 25.34 | 54.07 |
| 390 | 48.73 | 36.46 | 62.90 |
| 400 | 57.14 | 46.32 | 70.32 |
| 410 | 64.26 | 54.43 | 75.90 |
| 420 | 69.85 | 60.88 | 79.77 |
| 430 | 74.21 | 66.28 | 82.55 |
| 440 | 77.51 | 70.60 | 84.53 |
| 450 | 80.10 | 74.10 | 85.93 |
| 460 | 82.15 | 76.96 | 86.99 |
| 470 | 83.78 | 79.33 | 87.86 |
| 480 | 85.01 | 81.25 | 88.53 |
| 490 | 86.01 | 82.84 | 89.08 |
| 500 | 86.76 | 84.08 | 89.53 |
| 510 | 87.37 | 85.06 | 89.90 |
| 520 | 87.81 | 85.80 | 90.21 |
| 530 | 88.22 | 86.42 | 90.53 |
| 540 | 88.52 | 86.94 | 90.79 |
| 550 | 88.75 | 87.32 | 91.03 |
| 560 | 88.96 | 87.63 | 91.25 |
| 570 | 89.10 | 87.87 | 91.41 |
| 580 | 89.23 | 88.06 | 91.53 |
| 590 | 89.34 | 88.21 | 91.68 |
| 600 | 89.42 | 88.37 | 91.82 |
| 610 | 89.46 | 88.44 | 91.90 |
| 620 | 89.51 | 88.54 | 91.94 |
| 630 | 89.53 | 88.62 | 92.00 |
| 640 | 89.57 | 88.68 | 92.04 |
| 650 | 89.61 | 88.75 | 92.10 |
| 660 | 89.64 | 88.77 | 92.15 |
| 670 | 89.64 | 88.78 | 92.17 |
| 680 | 89.68 | 88.83 | 92.21 |
| 690 | 89.70 | 88.89 | 92.25 |
| 700 | 89.70 | 88.85 | 92.24 |
| 710 | 89.70 | 88.85 | 92.26 |
| 720 | 89.71 | 88.90 | 92.27 |
| 730 | 89.64 | 88.85 | 92.22 |
| 740 | 89.52 | 88.76 | 92.03 |
| 750 | 89.33 | 88.59 | 91.87 |

A composition of the invention (Example 3) shows improved thermal stability and improved transmission especially in the near UV region of the spectrum (about 400–450 nm) compared to Example 1 containing cycloaliphatic epoxy resin and Example 2 containing aromatic epoxy resin.

The epoxy resin compositions of the present invention can be used in applications known for epoxy resin compositions. Such applications comprise coatings, potting compounds, and encapsulants for solid state devices. In one embodiment a solid state device is a LED. FIG. 1 schematically illustrates a LED 1 according to one embodiment of the present invention. The LED 1 contains a LED chip 4, which is electrically connected to a lead frame 5. For example, the LED chip 4 may be directly electrically connected to an anode or cathode electrode of the lead frame 5 and connected by a lead 7 to the opposite cathode or anode electrode of the lead frame 5, as illustrated in FIG. 1. In a particular embodiment illustrated in FIG. 1, the lead frame 5 supports the LED chip 4. However, the lead 7 may be omitted, and the LED chip 4 may straddle both electrodes of the lead frame 5 with the bottom of the LED chip 4 containing the contact layers, which contact both the anode and cathode electrode of the lead frame 5. Alternatively, the LED chip 4 may be connected with a separate lead 7 to the cathode and the anode electrode of the lead frame 5. The lead frame 5 connects to a power supply, such as a current or voltage source or to another circuit (not shown).

The LED chip 4 emits radiation from the radiation emitting surface 9. The LED may emit visible, ultraviolet or infrared radiation. The LED chip may comprise any LED chip containing a p-n junction of any semiconductor layers capable of emitting the desired radiation. For example, the LED chip may contain any desired Group III–V compound semiconductor layers, such as GaAs, GaAlAs, GaN, InGaN, GaP, etc., or Group II–VI compound semiconductor layers such ZnSe, ZnSSe, CdTe, etc., or Group IV–IV semiconductor layers, such as SiC. The LED chip 4 may also contain other layers, such as cladding layers, waveguide layers and contact layers.

The LED 1 is packaged with an encapsulant 11 of the present invention. An alternative term for encapsulant is encapsulating material. In one embodiment the LED packaging includes encapsulant 11 located in a package, such as a shell 14. The shell may be any plastic or other material, such as polycarbonate, which is transparent to the LED radiation. However, the shell 14 may be omitted to simplify processing if encapsulant 11 has sufficient toughness and rigidity to be used without a shell. Thus, the outer surface of encapsulant 11 would act in some embodiments as a shell 14 or package. The shell 14 contains a light or radiation emitting surface 15 above the LED chip 4 and a non-emitting surface 16 adjacent to the lead frame 5. The radiation emitting surface 15 may be curved to act as a lens and/or may be colored to act as a filter. In various embodiments the non-emitting surface 16 may be opaque to the LED radiation, and may be made of opaque materials such as metal. The shell 14 may also contain a reflector around the LED chip 4, or other components, such as resistors, etc., if desired.

In other embodiments encapsulating materials may optionally contain a phosphor to optimize the color output of the LED 1. For example, a phosphor may be interspersed or mixed as a phosphor powder with encapsulant 11 or coated as a thin film on the LED chip 4 or coated on the inner surface of the shell 14. Any phosphor material may be used with the LED chip. For example, a yellow emitting cerium doped yttrium aluminum garnet phosphor (YAG:Ce$^{3+}$) may be used with a blue emitting InGaN active layer LED chip to produce a visible yellow and blue light output which appears white to a human observer. Other combinations of LED chips and phosphors may be used as desired.

While the packaged LED chip 4 according to one embodiment illustrated in FIG. 1 is supported by the lead frame 5, the LED 1 can have various other structures. For example, the LED chip 4 may be supported by the bottom surface 16 of the shell 14 or by a pedestal (not shown) located on the bottom of the shell 14, instead of by the lead frame 5.

Figure 2:
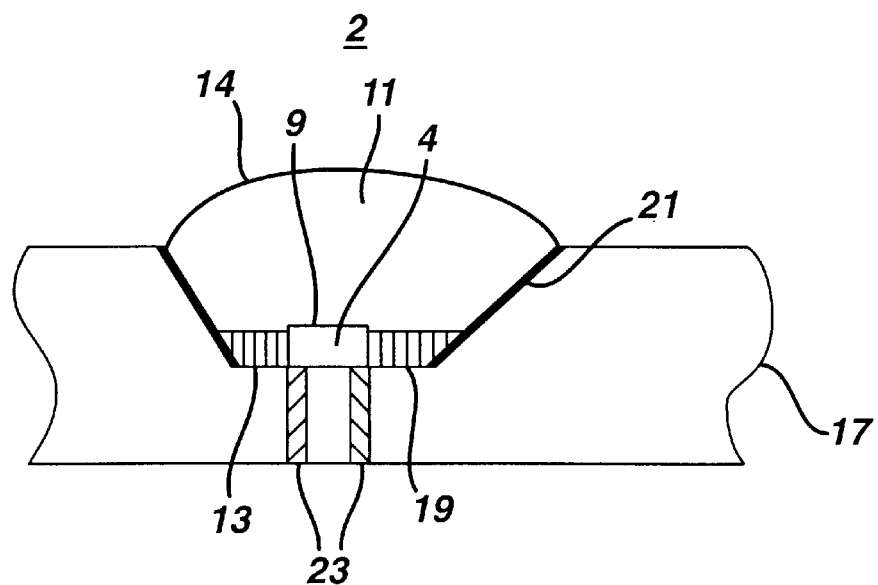
FIG. 2 is a schematic illustration of a LED according to another embodiment of the present invention.

In another embodiment of the present invention, the LED chip 4 of the LED 2 may be supported by a carrier substrate 17, as illustrated in FIG. 2. The carrier substrate 17 comprises a lower portion of the LED package, and may comprise any material, such as plastic, metal or ceramic. Preferably, the carrier substrate is made out of plastic and contains a groove 19 in which the LED chip 4 is located. The sides of the groove 19 may be coated with a reflective metal 21, such as aluminum, which acts as a reflector. However, the LED chip 4 may be formed over a flat surface of the substrate 17. The substrate 17 contains electrodes 23 that electrically contact the contact layers of the LED chip 4. Alternatively, the electrodes 23 may be electrically connected to the LED chip 4 with one or two leads as illustrated in FIG. 1. If desired, the shell 14 or a glass plate may be formed over the encapsulant 11 to act as a lens or protective material.

Figure 3:
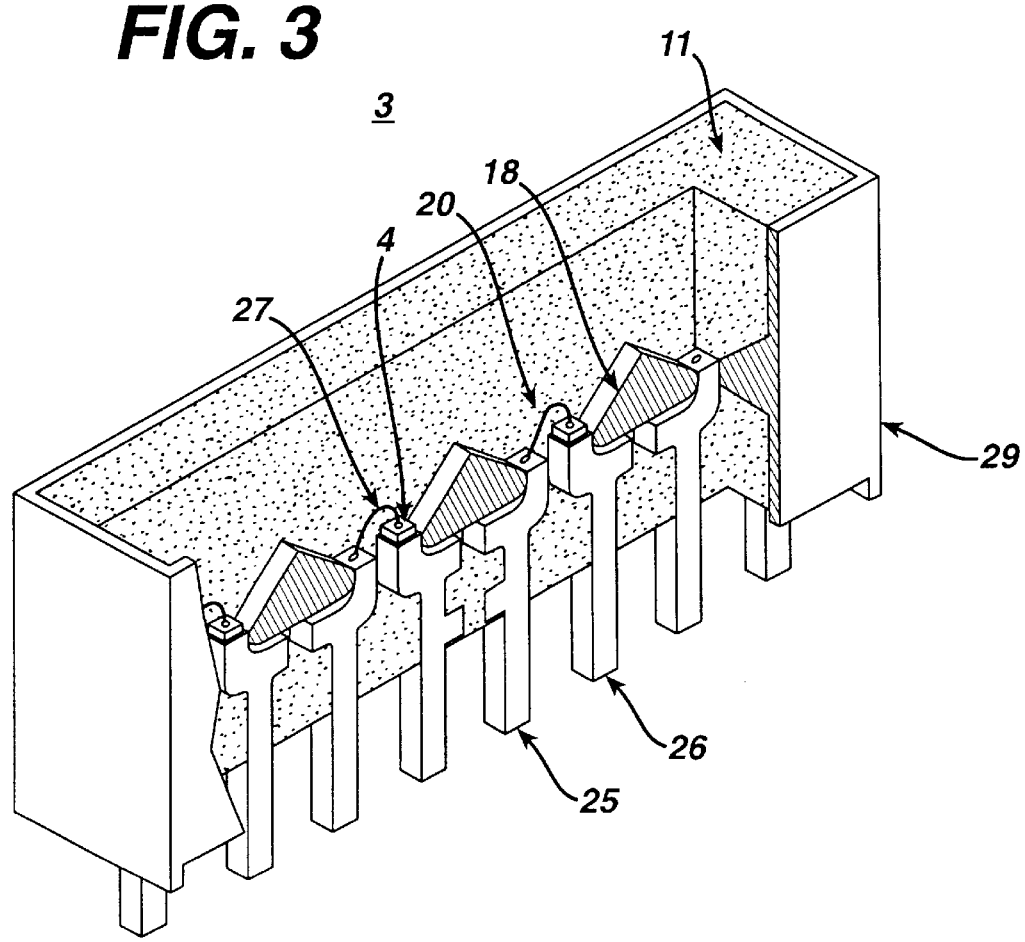
FIG. 3 is a schematic illustration of a LED according to still another embodiment of the present invention.

In another embodiment of the present invention a LED array 3 may be fabricated on a plastic substrate, as illustrated in FIG. 3. The LED chips or die 4 are physically and electrically mounted on cathode leads 26. The top surfaces of the LED chips 4 are electrically connected to anode leads 25 with lead wires 27. The lead wires may be attached by known wire bonding techniques to a conductive chip pad. The leads 26, 25 comprise a lead frame and may be made of a metal, such as silver plated copper. The lead frame and LED chip array 3 are contained in a plastic package 29, such as a polycarbonate package. In some embodiments the polycarbonate comprises a bisphenol A polycarbonate. The plastic package 29 is filled with an encapsulant 11 of the present invention. The package 29 contains tapered interior sidewalls 18, which enclose the LED chips 4, and form a light spreading cavity 20, which ensures cross fluxing of LED light.

While the invention has been illustrated and described in typical embodiments, it is not intended to be limited to the details shown, since various modifications and substitutions can be made without departing in any way from the spirit of the present invention. As such, further modifications and equivalents of the invention herein disclosed may occur to persons skilled in the art using no more than routine experimentation, and all such modifications and equivalents are believed to be within the spirit and scope of the invention as defined by the following claims. All Patents cited herein are incorporated herein by reference.

What is claimed is:

1. A curable epoxy resin composition for encapsulation of a solid state device, which comprises (A) at least one silicone epoxy resin, (B) at least one hydroxyl-containing compound. (C) at least one anhydride curing agent, and (D) at least one ancillary curing catalyst, wherein component (A) is present at a level of greater than about 40% by weight; component (B) is present at a level in a range of between about 1% by weight and about 20% by weight; component (C) is present at a level of less than about 25% by weight; and component (D) is present at a level in a range between about 0.008% by weight and about 10% by weight based on the combined weight of silicone epoxy resin (A), hydroxyl-containing compound (B), curing agent (C), and ancillary curing catalyst (D).

2. The composition of claim 1, wherein the silicone epoxy resin (A) comprises at least one silicon moiety selected from the group consisting of $R_3SiO_{0.5}$, $R_2SiO$, $RSiO_{1.5}$, and $SiO_2$, in combination with at least one epoxy-containing silicone moiety selected from the group consisting of $EpR_2SiO_{0.5}$, $EpRSiO$, and $EpSiO_{1.5}$, wherein Ep is an epoxy moiety selected from the group consisting of a glycidoxy propyl moiety as in formula (I), a 3,4-epoxycyclohexane ethyl moiety as in formula (II), and a 1,2-epoxy hexyl moiety as in formula (III):

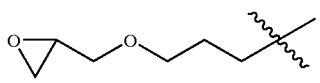
(I)

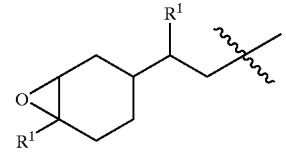
(II)

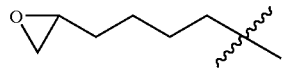
(III)

wherein R is monovalent alkyl, halogenated alkyl, or aryl, and $R^1$ is hydrogen or alkyl.

3. The composition of claim 2, wherein the silicone epoxy resin (A) comprises at least one compound selected from the group consisting of those depicted in formulas (IV), (V), (VI), (VII), (VIII), (IX), and (X):

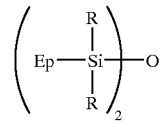
(IV)

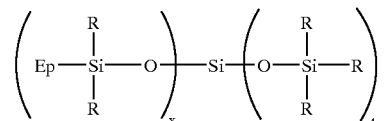
(V)

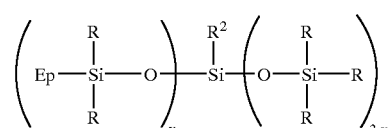
(VI)

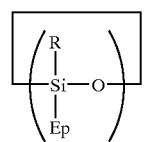
(VII)

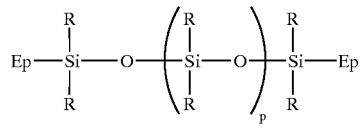
(VIII)

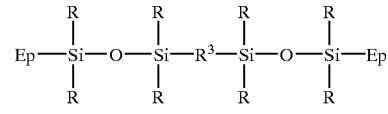
(IX)

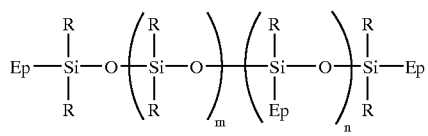
(X)

wherein the abbreviation "Ep" designates any of the epoxy structures depicted in formulas (I), (II), or (III); R and $R^2$ are each independently monovalent alkyl, halogenated alkyl, or aryl; $R^3$ is divalent alkyl, halogenated alkyl, or aryl; x is an integer between 1 and 4 inclusive; y is an integer between 1 and 3 inclusive; z is an integer between 3 and 12 inclusive; p is an integer having a value of 1 to about 80; m is an integer between about 20 and about 100; and n is an integer between about 1 and about 20.

4. The composition of claim 3, wherein the silicone epoxy resin (A) comprises 1,1,3,3-tetramethyl-1,3-bis[2(7-oxabicyclo[4.1.0]hept-3-yl)ethyl]disiloxane.

5. The composition of claim 1, wherein the hydroxyl-containing compound (B) comprises at least one compound selected from the group consisting of a primary alcohol, a secondary alcohol, a tertiary alcohol, a polyfunctional alcohol, a diol, a triol, a bisphenol, a trisphenol, benzyl alcohol, cyclohexanemethanol, an alkyl diol, cyclohexanedimethanol, ethylene glycol, propylene glycol, butanediol, pentanediol, hexanediol, heptanediol, octanediol, polyethylene glycol, glycerol, a polyether polyol, at least one compound with the formula (i):

wherein $R^4$ is a monovalent hydrocarbon radical or a halogenated monovalent hydrocarbon radical; and mixtures thereof.

6. The composition of claim 5, wherein the value for the parameter b is such that at least about 0.2 wt. % OH groups are present in hydroxyl-containing compound (B).

7. The composition of claim 5, wherein the hydroxyl-containing compound (B) comprises at least one silicone T resin.

8. The composition of claim 5, wherein the hydroxyl-containing compound (B) comprises at least one silicone T/D copolymer.

9. The composition of claim 8, wherein $R^4$ comprises a mixture of methyl and phenyl groups.

10. The composition of claim 9, wherein hydroxyl-containing compound (B) comprises the hydrolysis product of a mixture of phenyltrichlorosilane, methyltrichlorosilane, and dimethyldichlorosilane.

11. The composition of claim 1, wherein the anhydride curing agent (C) comprises at least one member selected from the group consisting of bicyclo[2.2.1]hept-5-ene-2,3-dicarboxylic anhydride, methylbicyclo[2.2.1]hept-5-ene-2,3-dicarboxylic anhydride, bicyclo[2.2.1]hept-5-ene-2,3-dicarboxylic anhydride, phthalic anhydride, pyromellitic dianhydride, hexahydrophthalic anhydride, hexahydro-4-methylphthalic anhydride, dodecenylsuccinic anhydride, dichloromaleic anhydride, chlorendic anhydride, and tetrachlorophthalic anhydride.

12. The composition of claim 11, wherein the anhydride curing agent (C) comprises hexahydro-4-methylphthalic anhydride.

13. The composition of claim 1, wherein the ancillary curing catalyst (D) comprises at least one member selected from the group consisting of an organometallic salt, a sulfonium salt and an iodonium salt.

14. The composition of claim 13, wherein the ancillary curing catalyst (D) comprises at least one member selected from the group consisting of a metal carboxylate, a metal acetylacetonate, zinc octoate, stannous octoate, triarylsulfonium hexafluorophosphate, triarylsulfonium hexafluoroantimonate, diaryliodonium hexafluoroantimonate, and diaryliodonium tetrakis(pentafluorophenyl)borate.

15. The composition of claim 1, further comprising at least one of thermal stabilizers, UV stabilizers, cure modifiers, coupling agents, or refractive index modifiers.

16. The composition of claim 15, comprising at least one of a thermal stabilizer or a UV stabilizer.

17. The composition of claim 16, comprising at least one of a hindered phenol stabilizer or a phosphite stabilizer.

18. The partially cured composition of claim 1.

19. The cured composition of claim 1.

20. A curable epoxy resin composition for encapsulation of a solid state device, which comprises (A) a silicone epoxy resin comprising 1,1,3,3-tetramethyl-1,3-bis[2(7-oxabicyclo[4.1.0]hept-3-yl)ethyl]disiloxane, (B) a hydroxyl-containing silicone resin comprising the hydrolysis product of a mixture of phenyltrichlorosilane, methyltrichlorosilane, and dimethyldichlorosilane, (C) a curing catalyst comprising hexahydro-4-methylphthalic anhydride, and (D) zinc octoate, wherein component (A) is present at a level of greater than about 40% by weight; component (B) is present at a level in a range of between about 1% by weight and about 20% by weight; component (C) is present at a level of less than about 25% by weight; and component (D) is present at a level in a range between about 0.008% by weight and about 10% by weight based on the combined weight of silicone epoxy resin (A), hydroxyl-containing compound (B), curing agent (C), and ancillary curing catalyst (D).

21. The composition of claim 20, further comprising at least one of a thermal stabilizer or a UV stabilizer.

22. The partially cured composition of claim 20.

23. The cured composition of claim 20.

* * * * *

UNITED STATES PATENT AND TRADEMARK OFFICE
CERTIFICATE OF CORRECTION

PATENT NO.    : 6,632,892 B1                                               Page 1 of 1
DATED         : October 14, 2003
INVENTOR(S)   : Malgorzata Iwona rubinsztajn et al.

It is certified that error appears in the above-identified patent and that said Letters Patent is hereby corrected as shown below:

<u>Column 15,</u>
Line 41, replace "." with -- , --

Signed and Sealed this

Twenty-fourth Day of February, 2004

JON W. DUDAS
*Acting Director of the United States Patent and Trademark Office*